(12) United States Patent
Won et al.

(10) Patent No.: US 11,301,100 B2
(45) Date of Patent: Apr. 12, 2022

(54) DISPLAY DEVICE

(71) Applicant: LG Display Co., Ltd., Seoul (KR)

(72) Inventors: Sang-Hyuk Won, Gimpo-si (KR);
Min-Joo Kim, Seoul (KR);
Chang-Hyun Song, Seongnam-si (KR);
Yong-Il Kim, Dangjin-si (KR);
Jong-Won Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/990,522

(22) Filed: Aug. 11, 2020

(65) Prior Publication Data
US 2020/0373362 A1 Nov. 26, 2020

Related U.S. Application Data

(63) Continuation of application No. 15/991,900, filed on May 29, 2018, now Pat. No. 10,777,620.

(30) Foreign Application Priority Data

May 31, 2017 (KR) .................. 10-2017-0067449

(51) Int. Cl.
| | | |
|---|---|---|
| *G06F 3/044* | (2006.01) | |
| *G06F 3/041* | (2006.01) | |
| *G09G 3/3233* | (2016.01) | |
| *H01L 27/32* | (2006.01) | |
| *H01L 51/52* | (2006.01) | |
| *H01L 51/56* | (2006.01) | |

(52) U.S. Cl.
CPC ............ *G06F 3/0446* (2019.05); *G06F 3/044* (2013.01); *G06F 3/0412* (2013.01); *G06F 3/0443* (2019.05); *G09G 3/3233* (2013.01); *H01L 27/322* (2013.01); *H01L 27/323* (2013.01); *H01L 27/3246* (2013.01); *H01L 51/5206* (2013.01); *H01L 51/5221* (2013.01); *H01L 51/5237* (2013.01); *H01L 51/56* (2013.01)

(58) Field of Classification Search
CPC . H01L 51/5246; H01L 51/525; H01L 27/323; H01L 27/3246; G06F 3/044; G09G 3/3208; G09G 3/3225; G09G 3/3233
See application file for complete search history.

(56) References Cited

U.S. PATENT DOCUMENTS

| | | |
|---|---|---|
| 2015/0060806 A1 | 3/2015 | Park et al. |
| 2015/0185942 A1 | 7/2015 | Kim et al. |
| 2015/0380685 A1 | 12/2015 | Lee et al. |
| 2016/0306472 A1 | 10/2016 | Park et al. |

(Continued)

FOREIGN PATENT DOCUMENTS

| | | |
|---|---|---|
| CN | 205789984 U | 12/2016 |
| CN | 106775173 A | 5/2017 |

(Continued)

*Primary Examiner* — Priyank J Shah
(74) *Attorney, Agent, or Firm* — Seed IP Law Group LLP

(57) ABSTRACT

A thin and lightweight display device is disclosed. An organic light-emitting display device having a touch sensor is configured such that an outer planarization layer fills a space between a plurality of dams, thereby preventing a short circuit between routing lines in the space between the dams, and such that touch electrodes are disposed on an encapsulation structure for encapsulating a light-emitting element, with the result that an additional bonding process is not required, whereby the process is simplified and cost is reduced.

4 Claims, 18 Drawing Sheets

(56) References Cited

U.S. PATENT DOCUMENTS

| | | |
|---|---|---|
| 2016/0315284 A1 | 10/2016 | Jeon |
| 2017/0125734 A1 | 5/2017 | Lee et al. |
| 2017/0179432 A1 | 6/2017 | Visweswaran et al. |
| 2017/0262109 A1 | 9/2017 | Choi et al. |
| 2018/0032189 A1 | 2/2018 | Lee et al. |
| 2018/0033832 A1 | 2/2018 | Park et al. |
| 2018/0039360 A1 | 2/2018 | Akimoto et al. |
| 2018/0061899 A1 | 3/2018 | Oh et al. |
| 2018/0083088 A1 | 3/2018 | Bae et al. |
| 2018/0095584 A1 | 4/2018 | Lee et al. |
| 2018/0138450 A1 | 5/2018 | Park et al. |
| 2018/0182818 A1 | 6/2018 | Kim |
| 2018/0226454 A1 | 8/2018 | Liu et al. |
| 2018/0308902 A1 | 10/2018 | Lee et al. |
| 2018/0323240 A1 | 11/2018 | Won et al. |
| 2018/0329552 A1 | 11/2018 | Song et al. |
| 2019/0326549 A1 | 10/2019 | Kokame et al. |
| 2019/0348476 A1 | 11/2019 | Kato |

FOREIGN PATENT DOCUMENTS

| | | |
|---|---|---|
| EP | 3293765 A1 | 3/2018 |
| JP | 2009129605 A | 6/2009 |
| JP | 2013015836 A | 1/2013 |
| JP | 2014029853 A | 2/2014 |
| JP | 2014153791 A | 8/2014 |
| JP | 2015050245 A | 3/2015 |
| JP | 2017027394 A | 2/2017 |
| JP | 2018124816 A | 8/2018 |
| KR | 10-2014-0085306 A | 7/2014 |
| KR | 10-2016-0081106 A | 7/2016 |
| KR | 10-2016-0124301 A | 10/2016 |
| WO | 03061346 A1 | 7/2003 |

DISPLAY DEVICE

CROSS-REFERENCE TO RELATED APPLICATIONS

This application is a continuation of U.S. patent application Ser. No. 15/991,900, filed May 29, 2018, which claims the benefit of Korean Patent Application No. 10-2017-0067449, filed May 31, 2017, which is hereby incorporated by reference as if fully set forth herein.

BACKGROUND

Technical Field

The present disclosure relates to a display device, and more particularly to a display device manufactured through a simplified process at reduced cost.

Description of the Related Art

A touchscreen is an input device that allows a user to input a command by selecting one of multiple instructions displayed on a screen, such as that of a display device, using a user's hand or an object. That is, the touchscreen converts the contact position, at which the user's hand or the object directly contacts the touchscreen, into an electrical signal to receive the instruction selected at the contact position as an input signal. The touchscreen has been increasingly used, since the touchscreen is capable of replacing an additional input device that is connected to the display device for operation, such as a keyboard or a mouse.

In most cases, the touchscreen is generally attached to the front of a display panel, such as a liquid crystal display panel or an organic light-emitting display panel, using an adhesive. Since the touchscreen is separately manufactured and is attached to the front of the display panel, the process is complicated and cost is increased due to the addition of an attaching step.

BRIEF SUMMARY

Accordingly, the present disclosure is directed to a display device that substantially obviates one or more problems due to limitations and disadvantages of the related art.

An object of the present disclosure is to provide a display device manufactured through a simplified process at reduced cost.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light-emitting display device having a touch sensor is configured such that an outer planarization layer fills a space between a plurality of dams, thereby preventing a short circuit between routing lines in the space between the dams, and such that touch electrodes are disposed on an encapsulation structure for encapsulating a light-emitting element, with the result that an additional bonding process is not required, whereby the process is simplified and cost is reduced.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts.

Figure 1:
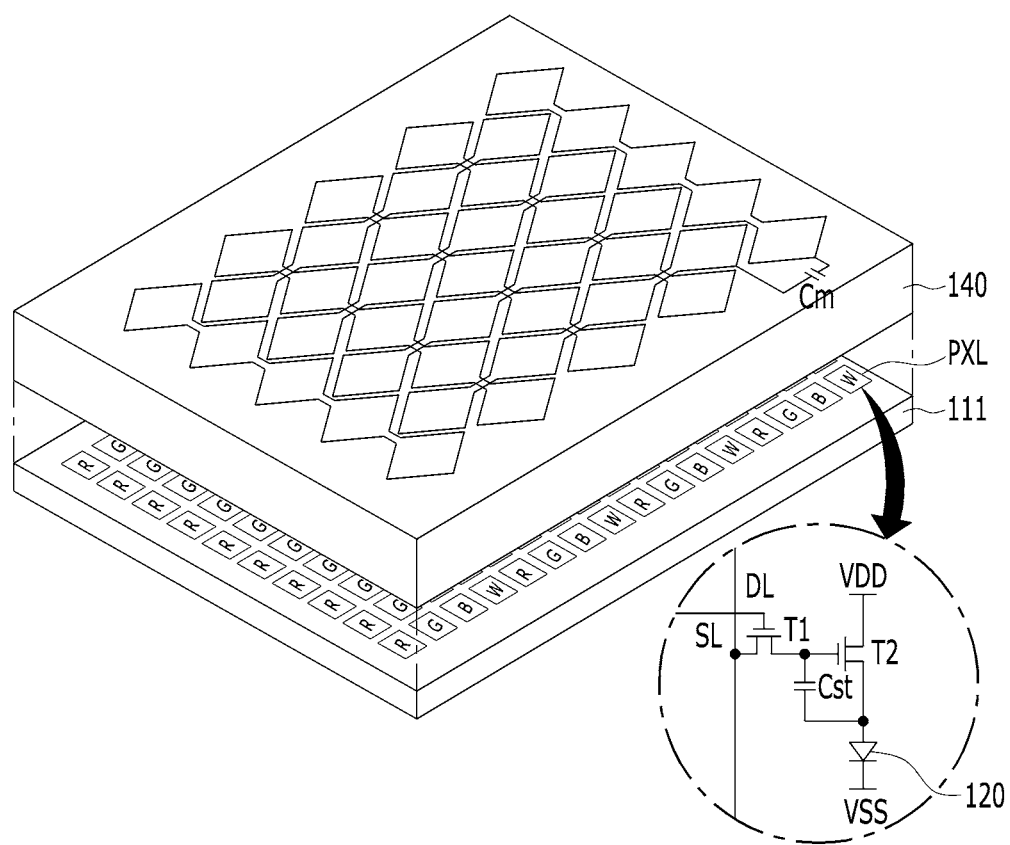
FIG. 1 is a perspective view showing an organic light-emitting display device having a touch sensor according to a first embodiment of the present disclosure.

FIG. 1 is a perspective view showing an organic light-emitting display device having a touch sensor according to the present disclosure.

Figure 2:
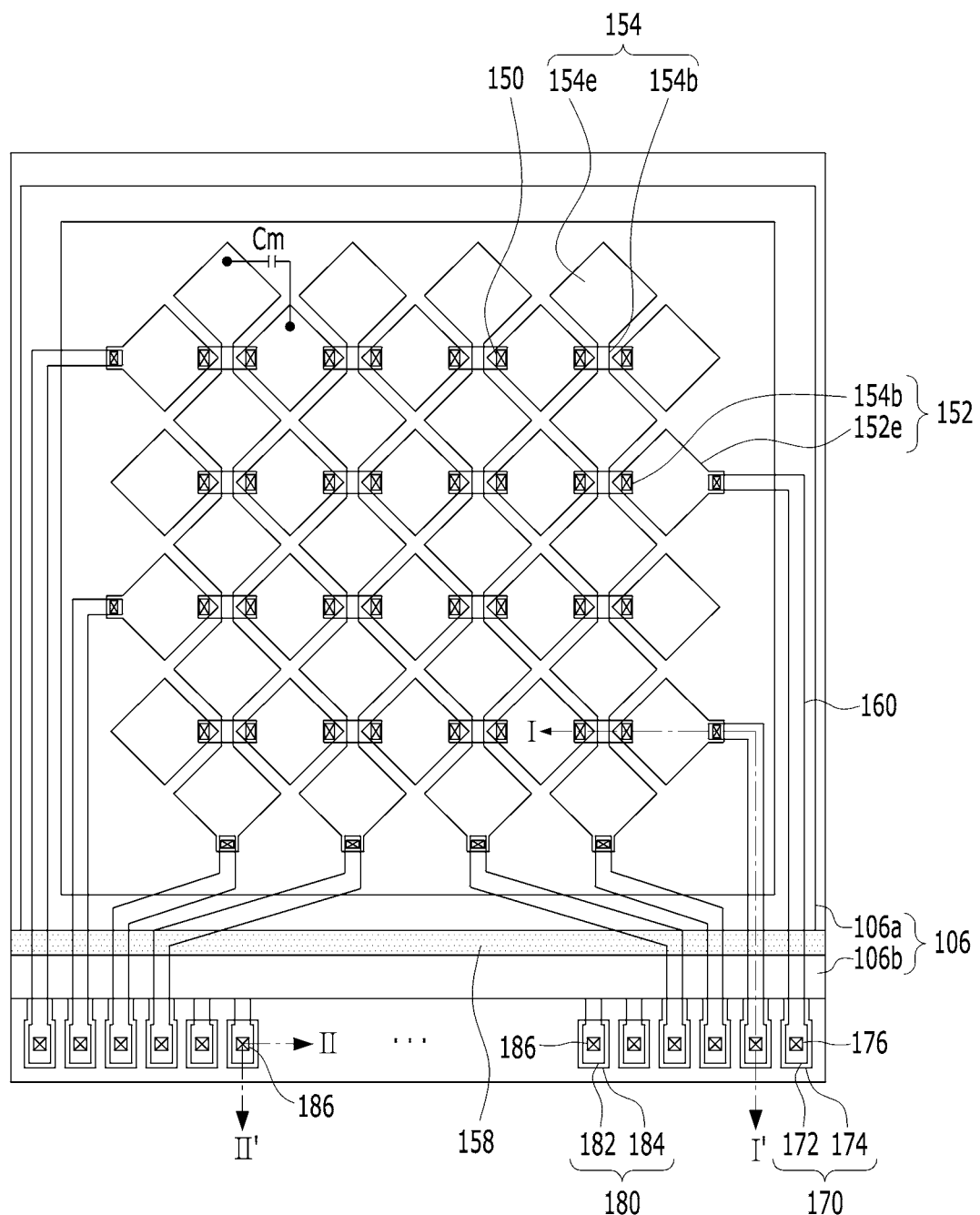
FIG. 2 is a plan view of the organic light-emitting display device having the touch sensor shown in FIG. 1.

The organic light-emitting display device having the touch sensor shown in FIG. 1 detects variation in a mutual capacitance Cm (the touch sensor) due to a user's touch through touch electrodes 152$e$ and 154$e$ shown in FIG. 2 during a touch period to sense whether a touch has been performed and the touched position. The organic light-emitting display device having the touch sensor shown in FIG. 1 displays an image through respective unit pixels each including a light-emitting element 120. Each unit pixel includes red (R), green (G), and blue (B) sub-pixels PXL. Alternatively, each unit pixel may include red (R), green (G), blue (B), and white (W) sub-pixels PXL.

To this end, the organic light-emitting display device shown in FIG. 1 includes a plurality of sub-pixels PXL arranged on a substrate 111 in a matrix fashion, an encapsulation structure 140 disposed on the sub-pixels PXL, and a mutual capacitance Cm disposed on the encapsulation structure 140.

Each of the sub-pixels PXL includes a pixel-driving circuit and a light-emitting element 120 connected to the pixel-driving circuit.

The pixel-driving circuit includes a switching transistor T1, a driving transistor T2, and a storage capacitor Cst. Meanwhile, in the present disclosure, the pixel-driving circuit has been described as including two transistors T and one capacitor C by way of example. However, the present disclosure is not limited thereto. That is, a 3T1C or 3T2C type pixel-driving circuit having three or more transistors T and one or more capacitors C may be used.

When a scan pulse is supplied to a scan line SL, the switching transistor T1 is turned on to supply a data signal, which is supplied to a data line DL, to the storage capacitor Cst and to a gate electrode of the driving transistor T2.

In response to the data signal supplied to the gate electrode of the driving transistor T2, the driving transistor T2 controls current I that is supplied from a high-voltage (VDD) supply line to the light-emitting element 120 to adjust the amount of light emitted by the light-emitting element 120. Even when the switching transistor T1 is turned off, the driving transistor T2 supplies uniform current to the light-emitting element 120 using voltage charged in the storage capacitor Cst such that the light-emitting element 120 keeps emitting light until a data signal of the next frame is supplied.

Figure 3:
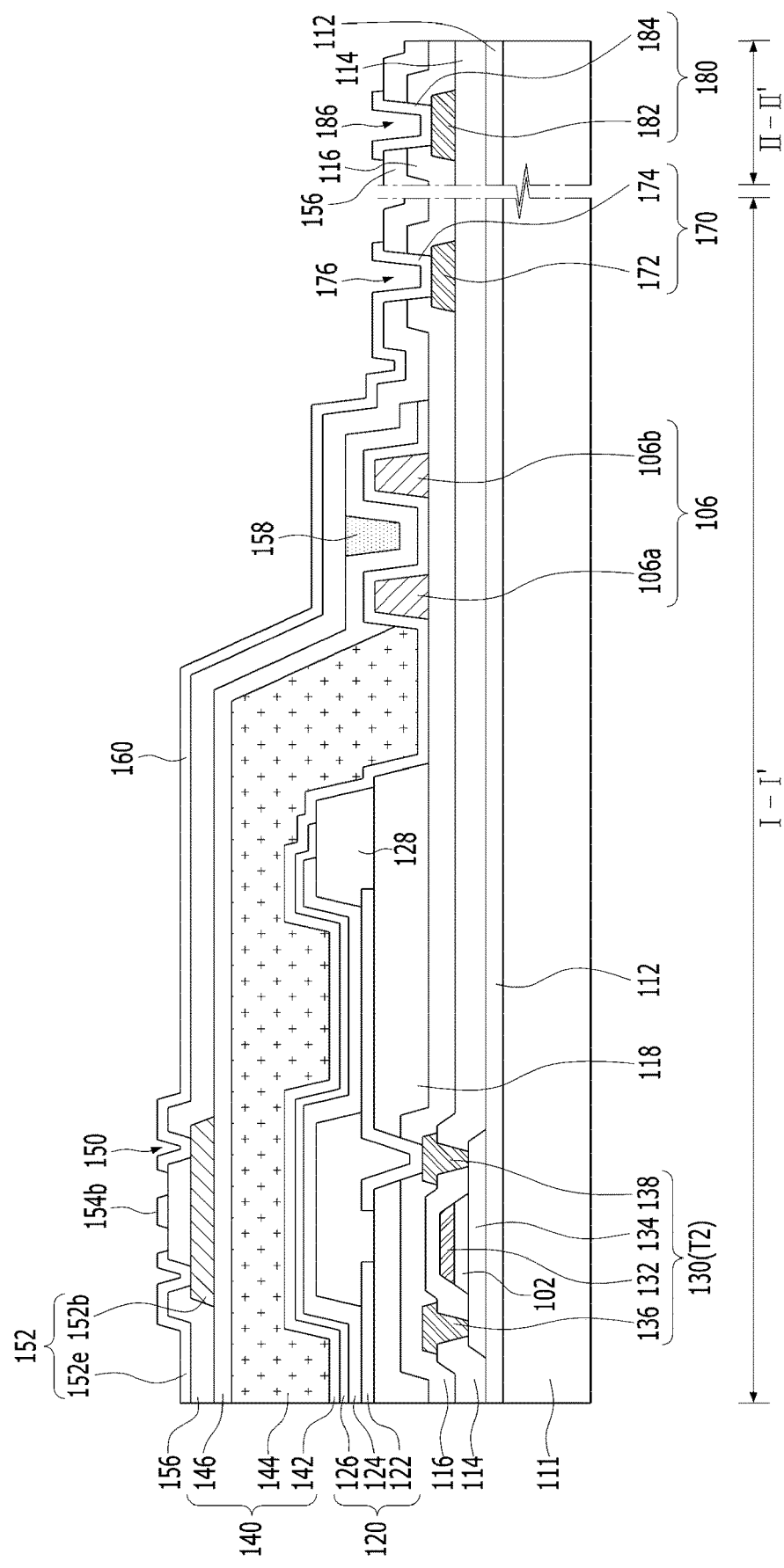
FIG. 3 is a sectional view of the organic light-emitting display device having the touch sensor taken along lines I-I' and II-IF of FIG. 1.

As shown in FIG. 3, the driving transistor 130 (T2) includes a semiconductor layer 134 disposed on a buffer layer 112, a gate electrode 132 overlapping the semiconductor layer 134 in the state in which a gate insulating film 102 is disposed therebetween, and source and drain electrodes 136 and 138 formed on an interlayer insulating film 114 so as to contact the semiconductor layer 134. The semiconductor layer 134 is formed of at least one of an amorphous semiconductor material, a polycrystalline semiconductor material, and an oxide semiconductor material.

The light-emitting element 120 includes an anode electrode 122, a light-emitting stack 124 formed on the anode electrode 122, and a cathode electrode 126 formed on the light-emitting stack 124.

The anode electrode 122 is electrically connected to a drain electrode 138 of the driving transistor 130 (T2), which is exposed through a pixel contact hole formed through a passivation film 116 and a pixel planarization layer 118.

At least one light-emitting stack 124 is formed on the anode electrode 122 in a light-emitting area defined by a bank 128. The light-emitting stack 124 is formed by stacking a hole-related layer, an organic light-emitting layer, and an electron-related layer on the anode electrode 122 in the forward order or in the reverse order. The light-emitting stack 124 may include first and second light-emitting stacks that are opposite each other in the state in which a charge generation layer is disposed therebetween. In this case, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 is incident on a color filter, which is located above or under the light-emitting stack 124, to realize a color image. Alternatively, each light-emitting stack 124 may generate colored light corresponding to each sub-pixel without an additional color filter in order to realize a color image. That is, the light-emitting stack 124 of the red (R) sub-pixel may generate red light, the light-emitting stack 124 of the green (G) sub-pixel may generate green light, and the light-emitting stack 124 of the blue (B) sub-pixel may generate blue light.

The cathode electrode 126 is formed so as to be opposite the anode electrode 122 in the state in which the light-emitting stack 124 is disposed therebetween, and is connected to a low-voltage (VSS) supply line.

The encapsulation structure 140 prevents external moisture or oxygen from permeating into the light-emitting element 120, which has low resistance to moisture or oxygen. To this end, the encapsulation structure 140 includes a plurality of inorganic encapsulation layers 142 and 146 and an organic encapsulation layer 144 disposed between the inorganic encapsulation layers 142 and 146. The inorganic encapsulation layer 146 is disposed at the uppermost layer. The encapsulation structure 140 includes at least two inorganic encapsulation layers 142 and 146 and at least one organic encapsulation layer 144. In the present disclosure, an encapsulation structure 140 having a structure in which an organic encapsulation layer 144 is disposed between first and second inorganic encapsulation layers 142 and 146 will be described by way of example.

The first inorganic encapsulation layer 142 is formed on a substrate 101, on which the cathode electrode 126 is formed, so as to be closest to the light-emitting element 120. The first inorganic encapsulation layer 142 is formed of an inorganic insulating material that can be deposited at a low temperature, such as silicon nitride ($SiN_x$), silicon oxide ($SiO_x$), silicon oxide nitride (SiON), or aluminum oxide ($Al_2O_3$). Consequently, the first inorganic encapsulation layer 142 is deposited in a low-temperature atmosphere, whereby it is possible to prevent damage to the light-emitting stack 124, which has low resistance to a high-temperature atmosphere, when the first inorganic encapsulation layer 142 is deposited.

The organic encapsulation layer 144 reduces stress that might occur between the layers due to bending of the organic light-emitting device and improves planarization. The organic encapsulation layer 144 is formed of an organic insulating material, such as acrylic resin, epoxy resin, polyimide, polyethylene, or silicon oxycarbide (SiOC).

In the case in which the organic encapsulation layer 144 is formed using an inkjet method, a dam 106 is disposed in order to prevent the organic encapsulation layer 144, which is in a liquid state, from spreading to the edge of the substrate 111. The dam 106 is disposed so as to be closer to the edge of the substrate 111 than the organic encapsulation layer 144. The organic encapsulation layer 144 is prevented from spreading to a pad area, which is located at the outermost region of the substrate 111 and in which a touch pad 170 and a display pad 180 are disposed, by the provision of the dam 106. To this end, as shown in FIG. 2, the dam may be formed so as to completely surround an active area, in which the light-emitting element 120 is disposed, or may be formed only between the active area and the pad area. In the case in which the pad area, in which the touch pad 170 and the display pad 180 are disposed, is located only at one side of the substrate 111, the dam 106 is also disposed only at one side of the substrate 111. In the case in which the pad area, in which the touch pad 170 and the display pad 180 are disposed, is located at each side of the substrate 111, the dam 106 is also disposed at each side of the substrate 111. At this time, the dams 106, which are spaced apart from each other by a predetermined distance, may be disposed side by side. Meanwhile, in the present disclosure, as shown in FIGS. 2 and 3, the dam 106 has been described as including a closed type first dam 106a for surrounding the active area and a second dam 106b disposed between the first dam 106a and the pad area by way of example. However, the present disclosure is not limited thereto.

Each of the first and second dams 106a and 106b is formed so as to have a single-layer structure or a multi-layer structure. For example, each of the first and second dams 106a and 106b is formed of the same material at the same time as at least one of the bank 128 and a spacer (not shown), whereby it is possible to prevent the addition of a mask process and an increase in cost.

The second inorganic encapsulation layer 146 is formed on the substrate 111, on which the organic encapsulation layer 144 is formed, so as to cover the upper surfaces and the side surfaces of the organic encapsulation layer 144 and the first inorganic encapsulation layer 142. Consequently, the second inorganic encapsulation layer 146 minimizes or prevents external moisture or oxygen from permeating into the first inorganic encapsulation layer 142 and the organic encapsulation layer 144. The second inorganic encapsulation layer 146 is formed of an inorganic insulating material, such as silicon nitride ($SiN_x$), silicon oxide ($SiO_x$), silicon oxide nitride (SiON), or aluminum oxide ($Al_2O_3$).

A touch-sensing line 154 and a touch-driving line 152 are disposed on the encapsulation structure 140 so as to intersect or otherwise overlap each other in the state in which a touch insulating film 156 is disposed therebetween, whereby a mutual capacitance Cm is formed at the intersection of the touch-sensing line 154 and the touch-driving line 152. Consequently, the mutual capacitance Cm charges an electric charge by a touch-driving pulse supplied to the touch-driving line 152 and discharges the charged electric charge to the touch-sensing line 154, thereby serving as a touch sensor. The term intersect is used herein in the broadest sense to include lines that overlap or overlie each other with one or more layers in between and is not limited to the meaning of the two line contact each other, merge or become combined.

The touch-driving line 152 includes a plurality of first touch electrodes 152e and first bridges 152b for electrically interconnecting the first touch electrodes 152e.

The first touch electrodes 152e are spaced apart from each other on the touch insulating film 156 by a predetermined distance in an X direction, which is a first direction. Each of the first touch electrodes 152e is electrically connected to an adjacent first touch electrode 152e via a corresponding one of the first bridges 152b.

The first bridges 152b are formed on the second inorganic encapsulation layer 146, and are exposed via touch contact holes 150, which are formed through the touch insulating film 156, so as to be electrically connected to the first touch electrode 152e. The first bridges 152b are disposed so as to overlap the bank 128, whereby it is possible to prevent the reduction of an aperture ratio due to the first bridges 152b.

The touch-sensing line 154 includes a plurality of second touch electrodes 154e and second bridges 154b for electrically interconnecting the second touch electrodes 154e.

The second touch electrodes 154e are spaced apart from each other on the touch insulating film 156 by a predetermined distance in a Y direction, which is a second direction. Each of the second touch electrodes 154e is electrically connected to an adjacent second touch electrode 154e via a corresponding one of the second bridges 154b.

The second bridges 154b are disposed on the touch insulating film 156, which is disposed in the same plane as the second touch electrodes 154e, so as to be electrically connected to the second touch electrodes 154e without additional contact holes. In the same manner as the first bridges 152b, the second bridges 154b are disposed so as to overlap the bank 128, whereby it is possible to prevent the reduction of an aperture ratio due to the second bridges 154b.

The touch-driving line 152 and the touch-sensing line 154 of the present disclosure are connected to a touch-driving unit (not shown) via a routing line 160 and the touch pad 170, respectively.

The touch pad 170 is connected to a signal transfer film (not shown), on which the touch-driving unit is mounted. The touch pad 170 is disposed on at least one of the buffer layer 112, the interlayer insulating film 114, and the passivation film 116, which is disposed between the substrate 111 and the encapsulation structure 140, in the state of being in contact therewith. For example, a structure in which the touch pad 170 is disposed on the interlayer insulating film 114 so as to contact the interlayer insulating film 114 will be described by way of example. The touch pad 170 includes a touch pad lower electrode 172 and a touch pad upper electrode 174.

The touch pad lower electrode 172 is formed of the same material and is disposed in the same plane as at least one of the gate electrode 132 or the source and drain electrodes 136 and 138 of the driving transistor 130 (T2) so as to have a single-layer or multi-layer structure. For example, the touch pad lower electrode 172 is formed of the same material as the source and drain electrodes 136 and 138, and is disposed on the interlayer insulating film 114. Consequently, the lower surface of the touch pad lower electrode 172 contacts the interlayer insulating film 114.

The touch pad upper electrode 174 is electrically connected to the touch pad lower electrode 172, which is exposed through a touch pad contact hole 176 formed through the passivation film 116 and the touch insulating film 156. The touch pad upper electrode 174 is formed of the same material as the routing line 160, and is formed using the same mask process as the routing line 160. Since the touch pad upper electrode 174 extends from the routing line 160, the touch pad upper electrode 174 is electrically connected to the routing line 160 not via an additional contact hole.

Meanwhile, the display pad 180 is also disposed in a non-active (bezel) area, in which the touch pad 170 is disposed. For example, as shown in FIG. 2, display pads 180 may be disposed between touch pads 170, or touch pads 170 may be disposed between display pads 180. In addition, the touch pad 1709 may be disposed at one side of the display panel, and the display pad 180 may be disposed at the other side of the display panel. Meanwhile, the disposition of the touch pad 170 and the display pad 180 is not limited to the structure shown in FIG. 2. The disposition of the touch pad 170 and the display pad 180 may be variously changed depending on the design of the display device.

The display pad 180 is formed so as to have a stacked structure different from the stacked structure of the touch pad 170. Alternatively, as shown in FIG. 3, the display pad 180 is formed so as to have the same stacked structure as the touch pad 170.

The display pad 180 shown in FIG. 3 includes a display pad lower electrode 182 and a display pad upper electrode 184.

The display pad lower electrode 182 is formed so as to be connected to at least one of the scan line SL, the data line DL, the low-voltage (VSS) supply line, and the high-voltage (VDD) supply line in the active area, in which the light-emitting element 120 is formed. The display pad lower electrode 182 is formed of the same material and is disposed in the same plane as at least one of the gate electrode 132 and the source and drain electrodes 136 and 138 of the driving transistor 130 (T2) so as to have a single-layer or multi-layer structure. For example, the display pad lower electrode 182 is formed of the same material as the source and drain electrodes 136 and 138, and is disposed on the interlayer insulating film 114, in the same manner as the touch pad lower electrode 172.

The display pad upper electrode 184 is electrically connected to the display pad lower electrode 182, which is exposed through a display pad contact hole 186 formed through the passivation film 116 and the touch insulating film 156. The display pad upper electrode 184 is formed of the same material as the routing line 160, and is formed using the same mask process as the routing line 160.

The routing line 160 transmits a touch-driving pulse generated by the touch-driving unit to the touch-driving line 152 via the touch pad 170, and transmits a touch signal from the touch-sensing line 154 to the touch-driving unit via the touch pad 170. Consequently, the routing line 160 is formed between the first touch electrodes 152e and the touch pad 170 and between the second touch electrodes 154e and the touch pad 170 to electrically connect the first and second touch electrodes 152e and 154e to the touch pad 170. Here, as shown in FIG. 2, the routing line 160 extends from the first touch electrodes 152e to at least one of the left side and the right side of the active area AA so as to be connected to the touch pad 170. In addition, the routing line 160 extends from the second touch electrodes 154e to at least one of the upper side and the lower side of the active area AA so as to be connected to the touch pad 170. The disposition of the routing line 160 may be variously changed depending on the design of the display device.

The routing line 160 is disposed above the dam 106 so as to intersect the first and second dams 106a and 106b. Between the first and second dams 106a and 106b, an outer planarization layer 158 is disposed at the outer region of the substrate 111, which does not overlap the light-emitting element 120, so as to fill the space between the first and second dams 106a and 106b. In this case, the routing line 160 is disposed so as to cover the side surface of the organic encapsulation layer 144 and the upper surface of the outer planarization layer 158. The routing line 160, disposed so as to cover the upper surface of the outer planarization layer 158, is disposed higher than the upper surface of the pixel planarization layer 118. The outer planarization layer 158 is formed of an organic insulating material having a high planarization function, such as an acrylic-based organic insulating material, an epoxy-based organic insulating material, or a siloxane-based organic insulating material.

The outer planarization layer 158, formed of an organic insulating material having a high planarization function, is formed between the dams 106a and 106b so as to have a thickness similar to the thickness of the dams 106a and 106b. In this case, the upper surface of the outer planariza-tion layer 158 is disposed in the same plane as the upper surface of the second inorganic encapsulation layer 146, which is disposed so as to cover the dams 106a and 106b, is disposed in the same plane as the upper surface of each of the dams 106a and 106b, or is disposed between the upper surface of the second inorganic encapsulation layer 146 and the upper surface of the dams 106a and 106b. Consequently, a step formed by the height of the dams 106a and 106b is planarized by the outer planarization layer 158, whereby the routing line 160, disposed above the outer planarization layer 158 and the dams 106a and 106b, is formed flat without any substantial step. As a result, the breakage or short-circuit of the routing line 160 crossing the dam 160 may be prevented.

Hereinafter, a routing line manufacturing method according to a comparative example that does not have the outer planarization layer 158 will be described with reference to FIGS. 4A to 4F, and a routing line manufacturing method according to the embodiment that has the outer planarization layer 158 will be described with reference to FIGS. 5A to 5F.

Figure 4A:
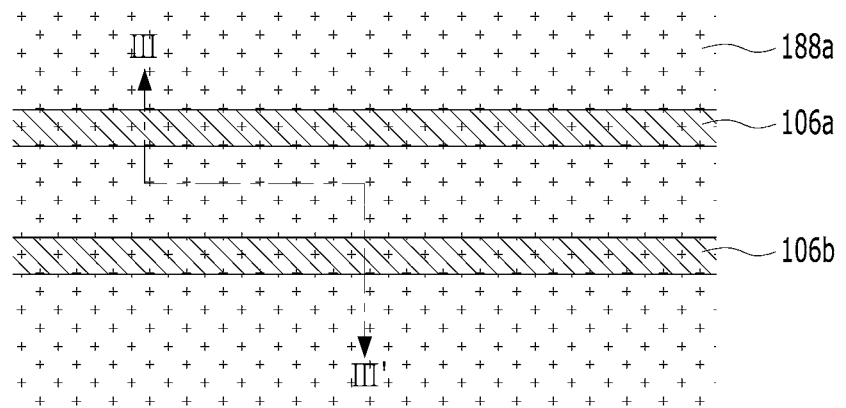
FIGS. 4A to 4F are plan and sectional views illustrating a manufacturing method according to a comparative example that does not have an outer planarization layer shown in FIG. 3.
Figure 4B:
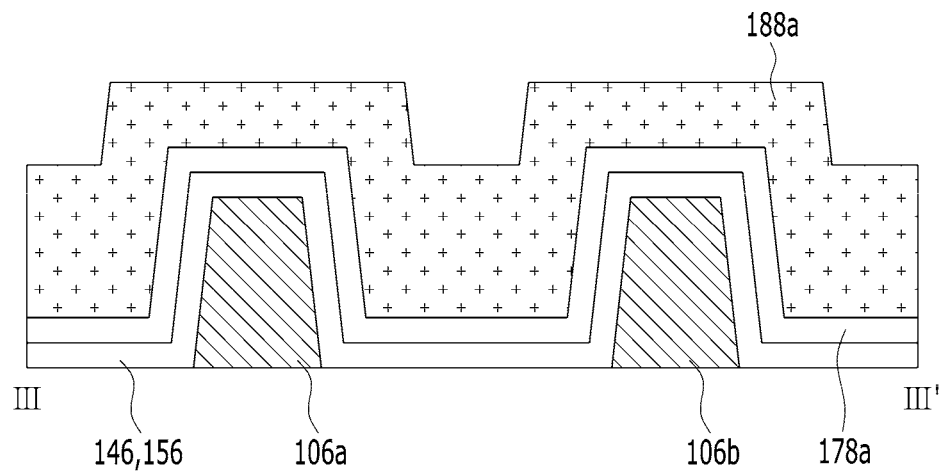
Figure 4C:
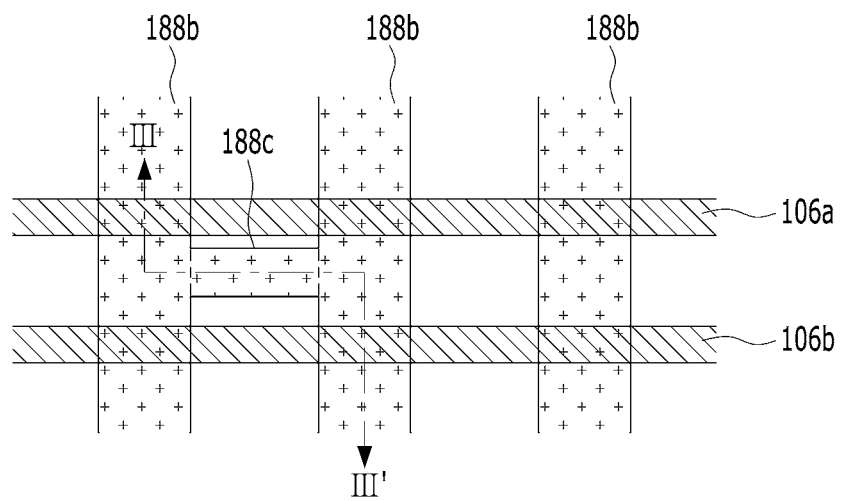
Figure 4D:
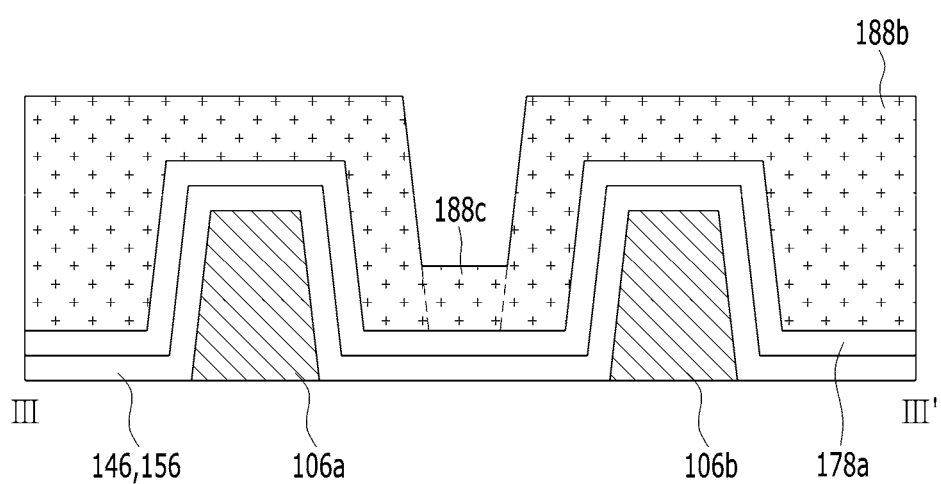
Figure 4E:
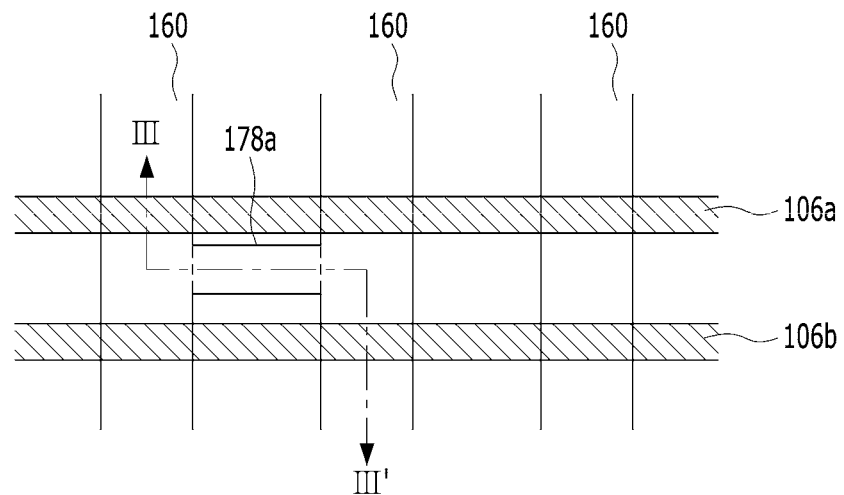
Figure 4F:
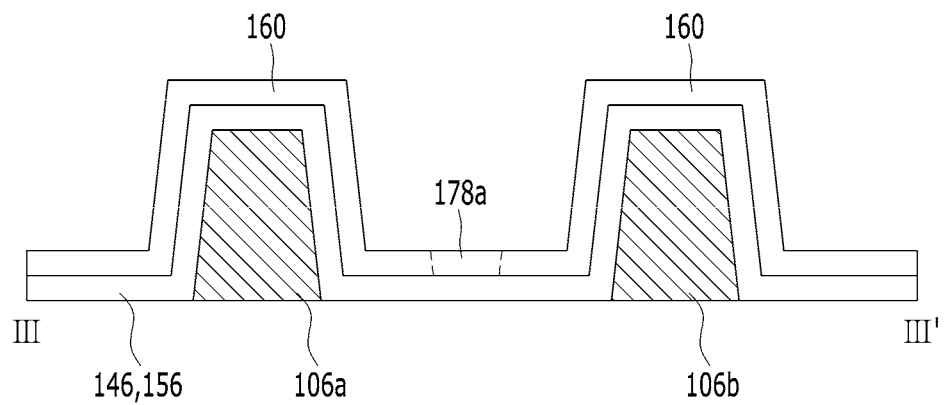

FIG. 4A is a plan view of one comparative example and FIG. 4B is sectional view along line III-III' of FIG. 4A. In the comparative example, as shown in FIGS. 4A and 4B, a conductive layer 178a is deposited on the entire surface of a touch insulating film 156 so as to cover a plurality of dams 106a and 106b, and a photoresist 188a is coated on the conductive layer 178a. At this time, the photoresist 188a is coated such that the thickness of the portion of the photoresist 188a formed between the dams 106a and 106b is greater than the thickness of the portion of the photoresist 188a formed above the dams 106a and 106b, since the photoresist 188a is a liquid-phase organic insulating material. At this time, if the amount of light exposure is set based on the thickness of the portion of the photoresist 188a formed above the dams 106a and 106b, the thick portion of the photoresist 188a formed between the dams 106a and 106b is not properly exposed to light. As a result, a residual photoresist film 188c remains after a development process, as shown in FIG. 4C. FIG. 4C is sectional view along line III-III' of FIG. 4C. If the conductive layer 178a is etched using a photoresist pattern 188b having the residual photoresist film 188c, as shown in FIG. 4E, the conductive layer 178a remains on a region corresponding to the residual photoresist film 188c, whereby a short circuit occurs between adjacent routing lines 160. FIG. 4F is sectional view along line III-III' of FIG. 4E.

Figure 5A:
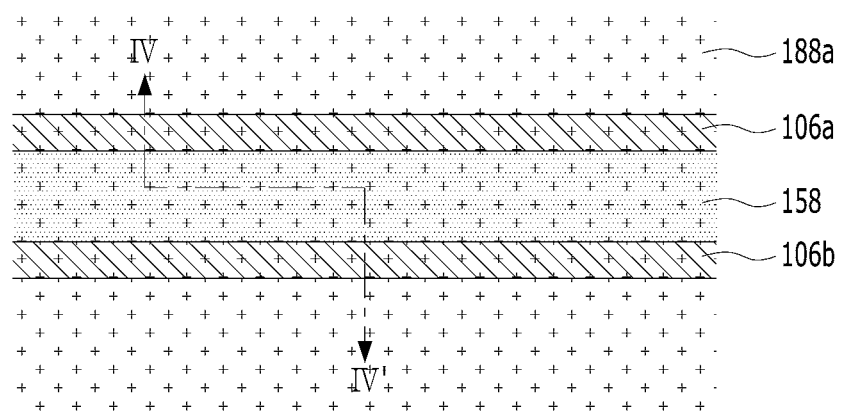
FIGS. 5A to 5F are plan and sectional views illustrating a manufacturing method according to the embodiment that has the outer planarization layer shown in FIG. 3.
Figure 5B:
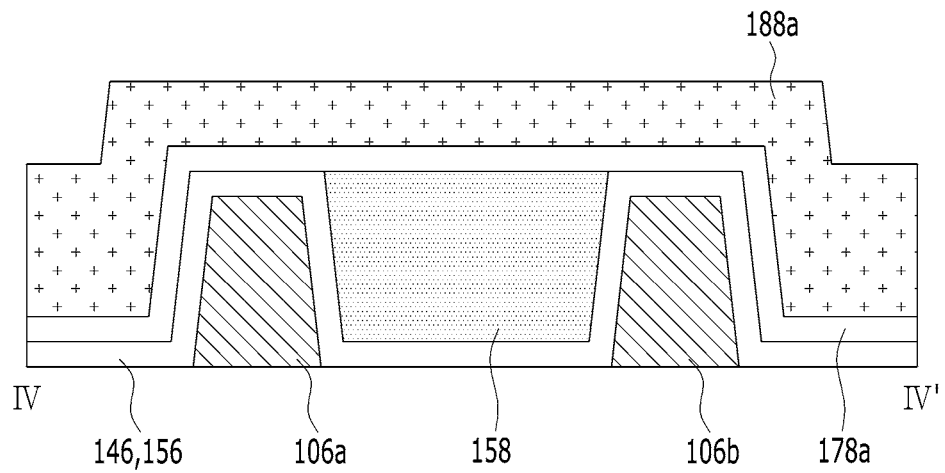
Figure 5C:
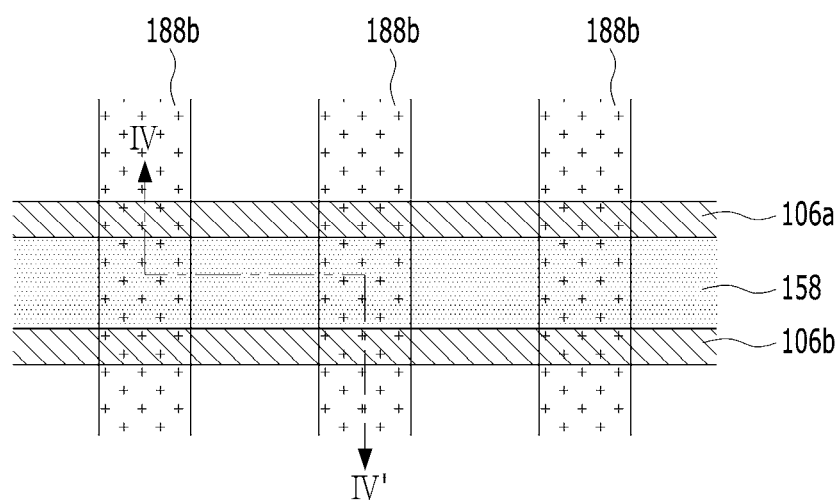
Figure 5D:
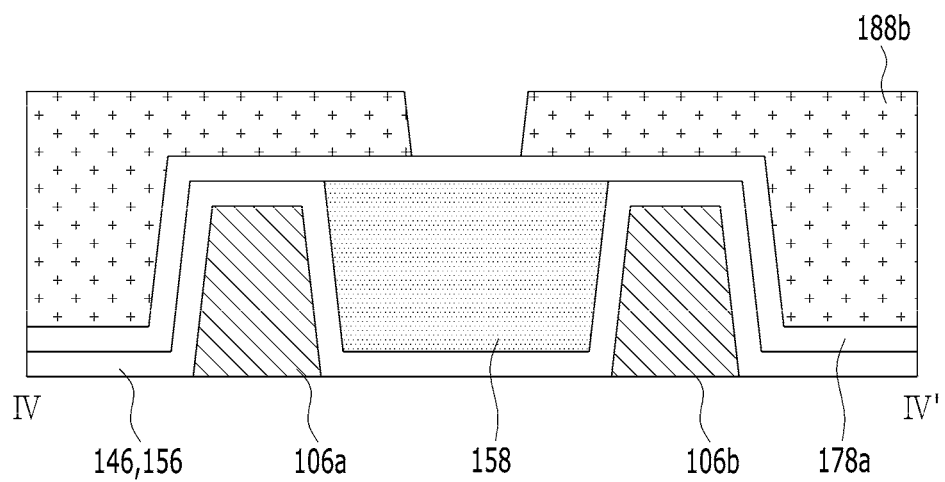
Figure 5E:
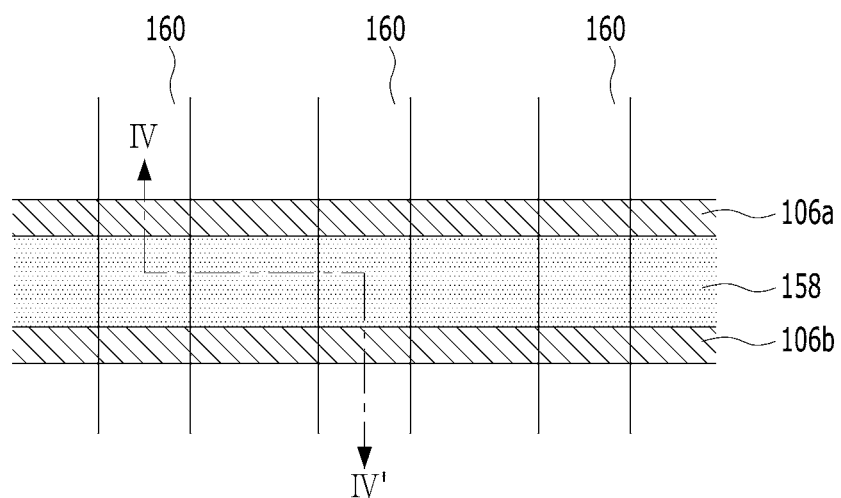
Figure 5F:
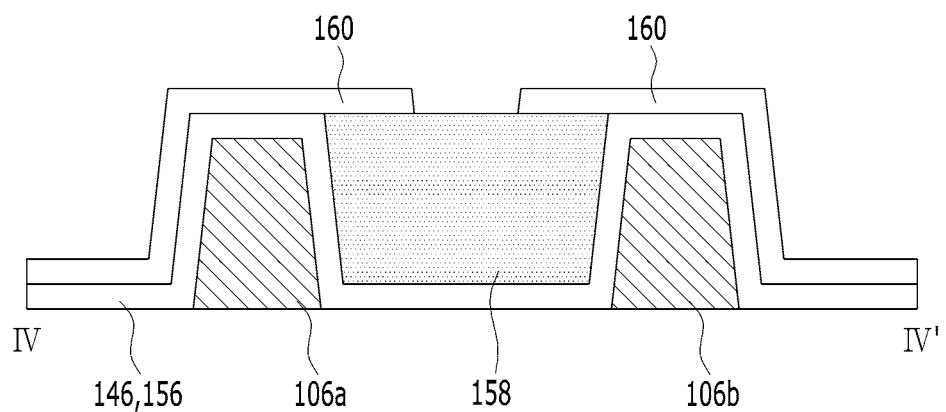

On the other hand, in the embodiment in which the outer planarization layer 158 is provided between the dams 106a and 106b, as shown in FIG. 5A, a conductive layer 178a is deposited on the entire surface of a substrate 111, on which an outer planarization layer 158 is formed, and a photoresist 188a is coated on the conductive layer 178a. FIG. 5A is a plan view of one comparative example and FIG. 5B is sectional view along line III-III' of FIG. 5A. At this time, in the embodiment in which the outer planarization layer 158 is provided between the dams 106a and 106b, the photoresist 188a is formed such that the portion of the photoresist 188a formed above the dams 106a and 106b and the portion of the photoresist 188a formed between the dams 106a and 106b have the same thickness. When the photoresist 188a is exposed to light and developed, as shown in FIG. 5C, a photoresist pattern 188b having the same thickness above the dams 106a and 106b and between the dams 106a and 106b is formed. FIG. 5D is sectional view along line III-III' of FIG. 5C. The conductive layer 178a is patterned by etching using the photoresist pattern 188b as a mask. As a result, routing lines 160 each having a desired line width based on the design thereof are formed, as shown in FIG. 5E. In the embodiment of the present disclosure, therefore, it is possible to prevent a short circuit between adjacent routing lines 160. FIG. 5F is sectional view along line III-III' of FIG. 5E.

In the organic light-emitting display device having the touch sensor according to the first embodiment of the present disclosure, the outer planarization layer 158 is provided to fill the space between the dams 106a and 106b. Consequently, it is possible to prevent the residual film of the photoresist film used to form the routing lines from remaining in the space between the dams 106a and 106b, whereby it is possible to prevent a short circuit between adjacent routing lines in the space between the dams 106a and 106b. In addition, a touchscreen is attached to a conventional organic light-emitting display device using an adhesive. In the organic light-emitting display device according to the present disclosure, however, the touch electrodes 152e and 154e are disposed on the encapsulation structure 140. Consequently, an additional bonding process is not required, whereby the process is simplified and cost is reduced.

Figure 6:
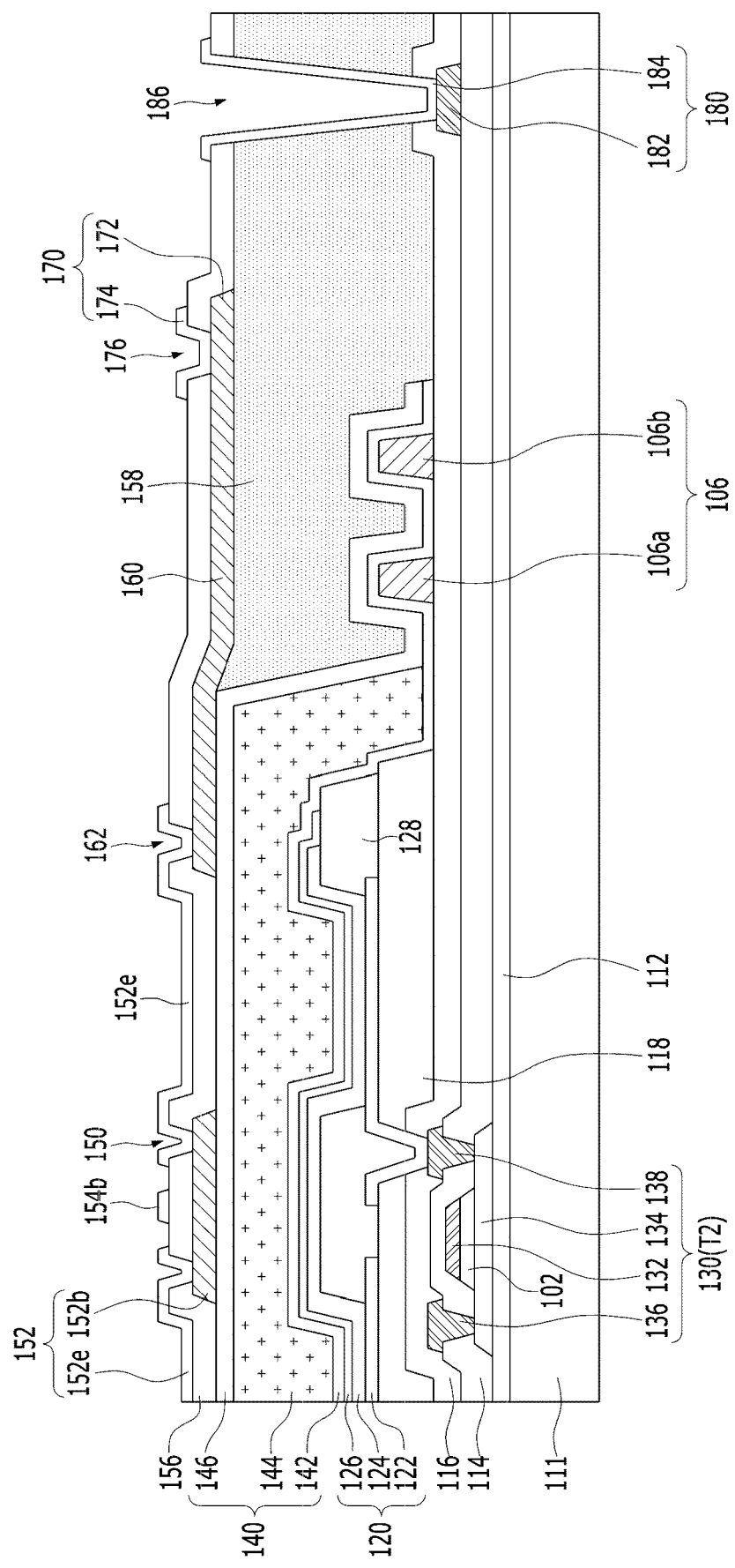
FIG. 6 is a sectional view showing an organic light-emitting display device having a touch sensor according to a second embodiment of the present disclosure.

FIG. 6 is a sectional view showing an organic light-emitting display device having a touch sensor according to a second embodiment of the present disclosure.

The organic light-emitting display device shown in FIG. 6 is identical in construction to the organic light-emitting display device shown in FIG. 3 except that the outer planarization layer 158 is formed to fill the space between the organic encapsulation layer 144 and the first dam 106a as well as the space between the dams 106a and 106b. Consequently, a detailed description of the same components will be omitted. Both dams are adjacent to the organic encapsulation layer 144, the first dam 106a is bordering on the organic encapsulation layer and the second dam 106b is spaced from the first dam a selected distance and is near to, namely, adjacent to the organic encapsulation layer As shown in FIG. 6, an outer planarization layer 158 is formed to fill a space between dams 106a and 106b and a space between an organic encapsulation layer 144 and the first dam 106a, which is the closest to the organic encapsulation layer 144. At this time, the upper surface of the outer planarization layer 158 is disposed in the same plane as the upper surface of a second inorganic encapsulation layer 146, which is disposed so as to cover the dams 106a and 106b, is disposed in the same plane as the upper surface of each of the dams 106a and 106b or the upper surface of the organic encapsulation layer 144, or is disposed between the upper surface of the dams 106a and 106b and the upper surface of the organic encapsulation layer 144. In this case, it is possible to prevent a residual film of a photoresist film used to form a routing line 160 from remaining in the space between the dams 106a and 106b and in the space between the first dam 106a and the organic encapsulation layer 144. Consequently, it is possible to prevent a short circuit of the routing line 160 in the space between the dams 106a and 106b and the space between the first dam 106a and the organic encapsulation layer 144.

The routing line 160 is disposed so as to cross the outer planarization layer 158, which is disposed so as to cover the first and second dams 106a and 106b. The routing line 160 is exposed on the organic encapsulation layer 144 through a routing contact hole 162 formed through a touch insulating film 156 so as to be connected to first and second touch electrodes 152e and 154e.

A touch pad 170 is connected to the routing line 160 on the outer planarization layer 158. The touch pad 170 includes a touch pad lower electrode 172 and a touch pad upper electrode 174.

The touch pad lower electrode 172 is formed of the same material as the routing line 160, and is formed using the same mask process as the routing line 160. Since the touch pad lower electrode 172 extends from the routing line 160 on the outer planarization layer 158, the touch pad lower electrode 172 is electrically connected to the routing line 160 not via an additional contact hole.

The touch pad upper electrode 174 is electrically connected to the touch pad lower electrode 172, which is exposed through a touch pad contact hole 176 formed through the touch insulating film 156. The touch pad upper electrode 174 is formed of the same material as a second bridge 154b, and is formed using the same mask process as the second bridge 154b.

A display pad 180 is also disposed in a non-active (bezel) area, in which the touch pad 170 is disposed. The display pad 180 includes a display pad lower electrode 182 and a display pad upper electrode 184.

The display pad lower electrode 182 is formed so as to be connected to at least one of a scan line SL, a data line DL, a low-voltage (VSS) supply line, and a high-voltage (VDD) supply line in an active area, in which a light-emitting element 120 is formed. The display pad lower electrode 182 is formed of the same material and is disposed in the same plane as at least one of a gate electrode 132 and source and drain electrodes 136 and 138 of a driving transistor 130 (T2) so as to have a single-layer or multi-layer structure. For example, the display pad lower electrode 182 is formed of the same material as the source and drain electrodes 136 and 138, and is disposed on an interlayer insulating film 114.

The display pad upper electrode 184 is electrically connected to the display pad lower electrode 182, which is exposed through a display pad contact hole 186 formed through a passivation film 116, the outer planarization layer 158, and the touch insulating film 156. The display pad upper electrode 184 is formed of the same material as the second bridge 154b, and is formed using the same mask process as the second bridge 154b.

Figure 7:
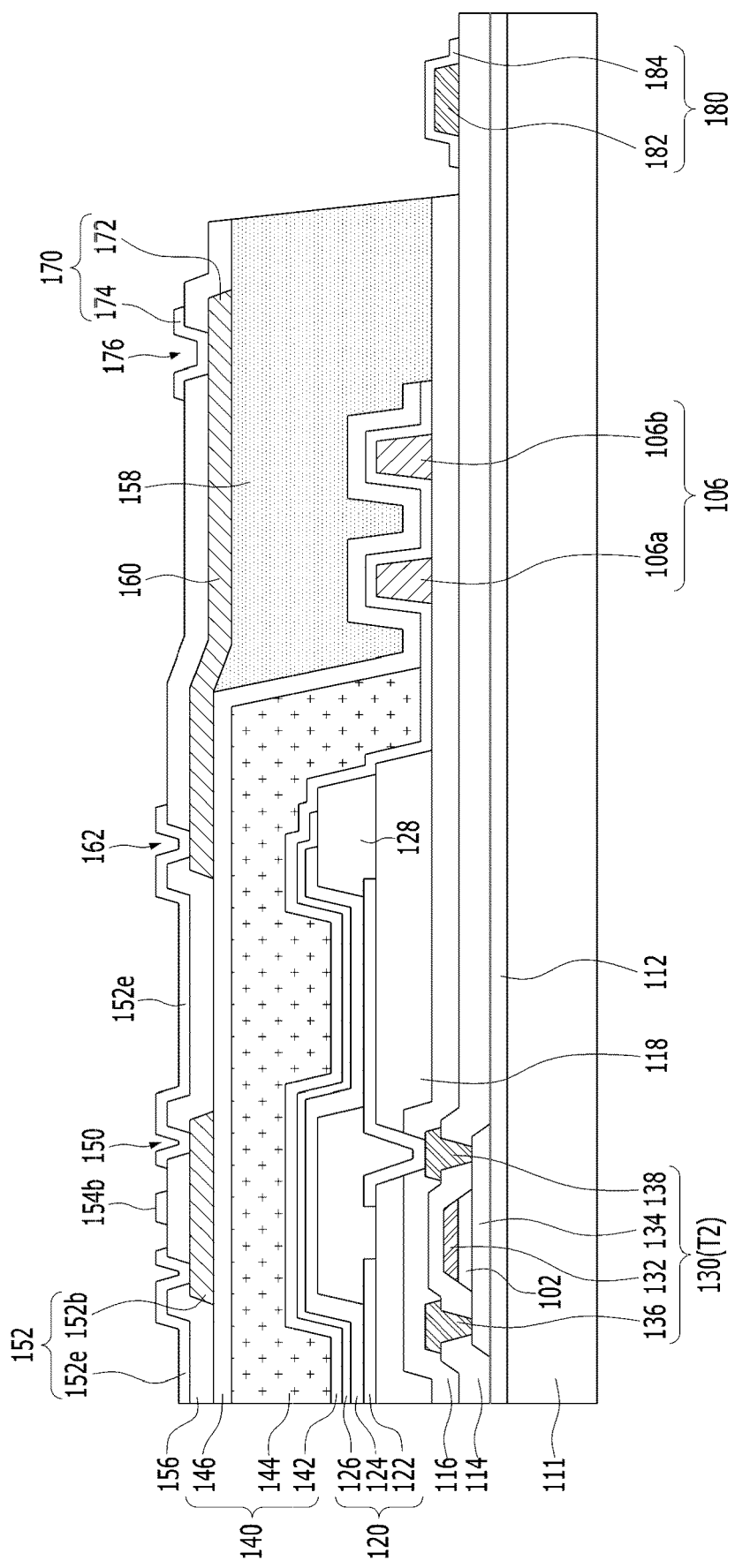
FIG. 7 is a sectional view showing another embodiment of a display pad shown in FIG. 6.

Alternatively, as shown in FIG. 7, the display pad upper electrode 184 may be directly connected to the display pad lower electrode 182 not via the display pad contact hole 186. In this case, the display pad upper electrode 184 is disposed so as to cover the side surface and the upper surface of the display pad lower electrode 182. The display pad upper electrode 184 is formed of the same material using the same mask process as any one of an anode electrode 122, a cathode electrode 126, and the second bridge 154b.

FIGS. 8A to 8D are views illustrating a method of manufacturing an organic light-emitting display device having a touch sensor according to the present disclosure. Hereinafter, a method of manufacturing the organic light-emitting display device shown in FIG. 6 will be described by way of example.

Figure 8A:
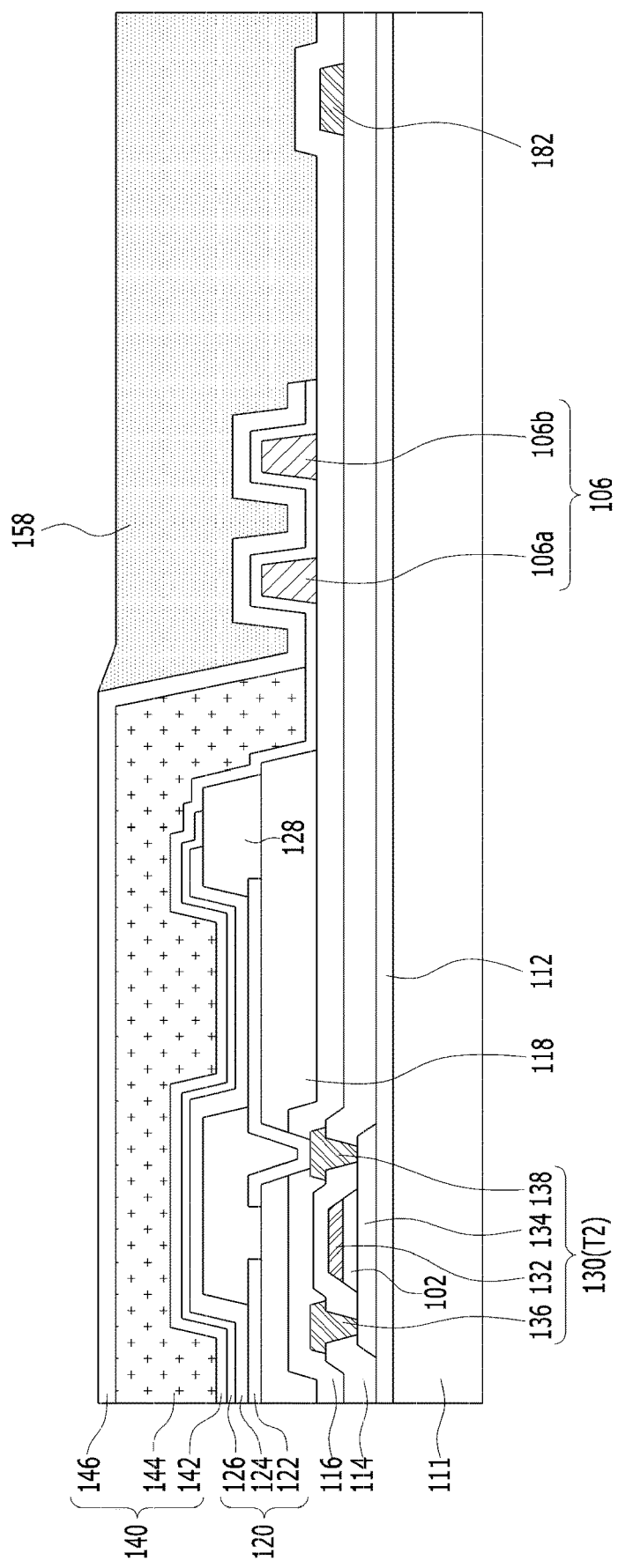
FIGS. 8A to 8D are sectional views illustrating a method of manufacturing the organic light-emitting display device having the touch sensor shown in FIG. 6.

Referring to FIG. 8A, an outer planarization layer 158 is formed on a substrate 110, on which a switching transistor, a driving transistor 130 (T2), a light-emitting element 120, a dam 106, and an encapsulation structure 140 are formed.

Specifically, an organic insulating material is coated on the entire surface of the substrate 110, on which the switching transistor, the driving transistor 130 (T2), the light-emitting element 120, the dam 106, and the encapsulation structure 140 are formed. At this time, the organic insulating material is coated such that the portion of the organic insulating material in a region in which no organic encapsulation layer 144 is formed is thicker than the portion of the organic insulating material in a region in which the organic encapsulation layer 144 is formed. Subsequently, the organic insulating material is dry-etched until a second inorganic encapsulation layer 146 on the organic encapsulation layer 144 is exposed, whereby an outer planarization layer 158 is formed. As shown in FIG. 6, the outer planarization layer 158 is disposed in the non-active area, excluding the active area, in which the light-emitting element 120 is formed.

Meanwhile, the outer planarization layer 158 shown in FIG. 3 is formed by patterning the organic insulating material through photolithography and etching such that the organic insulating material remains only between the dams 106a and 106b. The outer planarization layer 158 shown in FIG. 7 is formed by patterning the organic insulating material through photolithography and etching such that the active area, in which the light-emitting element 120 is formed, and the display pad lower electrode 182 are exposed.

As described above, the outer planarization layer 158 shown in FIG. 3 or 7 is formed by photolithography and etching using a photomask, whereas the outer planarization layer 158 shown in FIG. 6 is formed by etching without photolithography. Consequently, the display device shown in FIG. 6 is manufactured through a smaller number of processes than the display device shown in FIG. 3 or 7, whereby manufacturing cost is further reduced.

Figure 8B:
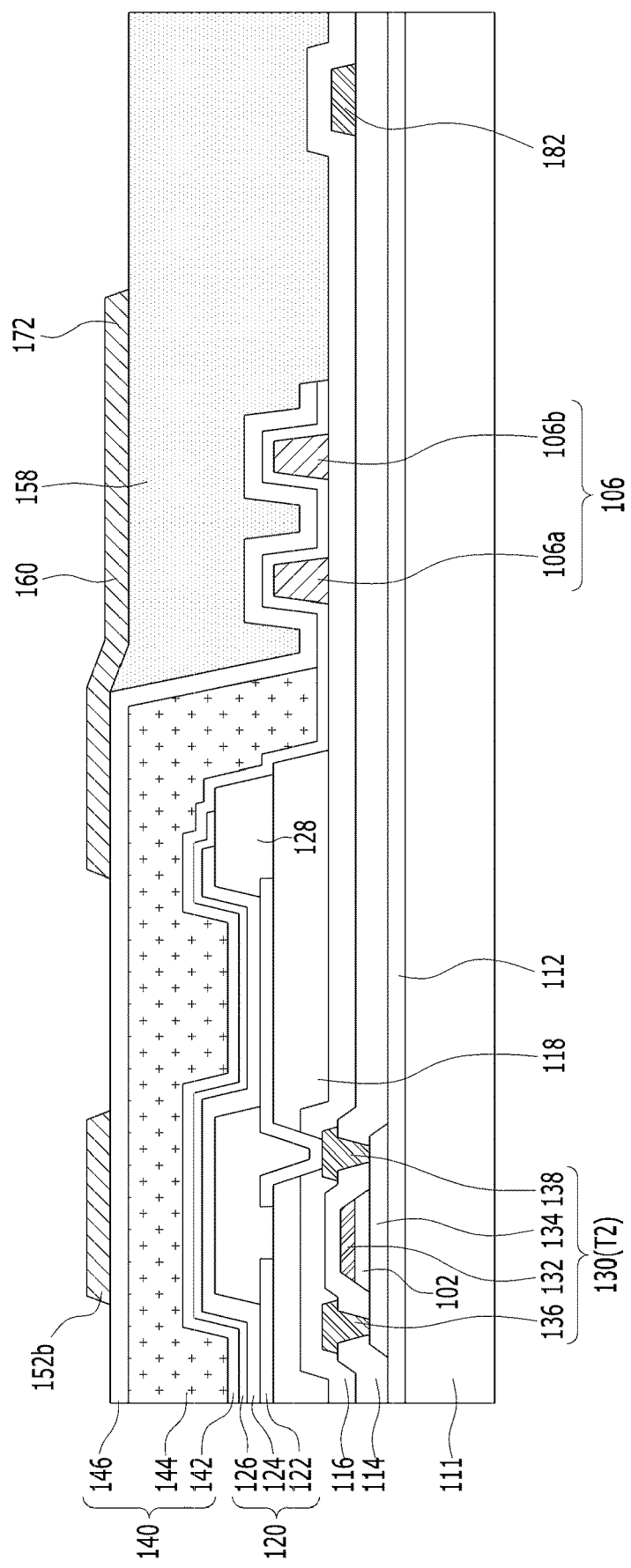

Referring to FIG. 8B, a first bridge 152b, a touch pad lower electrode 172, and a routing line 160 are formed on the substrate 111, on which the outer planarization layer 158 is formed.

Specifically, a first conductive layer is deposited on the substrate 111, on which the outer planarization layer 158 is formed, and the first conductive layer is patterned by photolithography and etching using a photomask. As a result, a first bridge 152b, a touch pad lower electrode 172, and a routing line 160 are formed on the substrate 111, on which the outer planarization layer 158 is formed. Here, the first conductive layer is formed of metal, such as Al, Ti, Cu, Mo, Ta, or MoTi, so as to have a single-layer structure or a multi-layer structure.

Figure 8C:
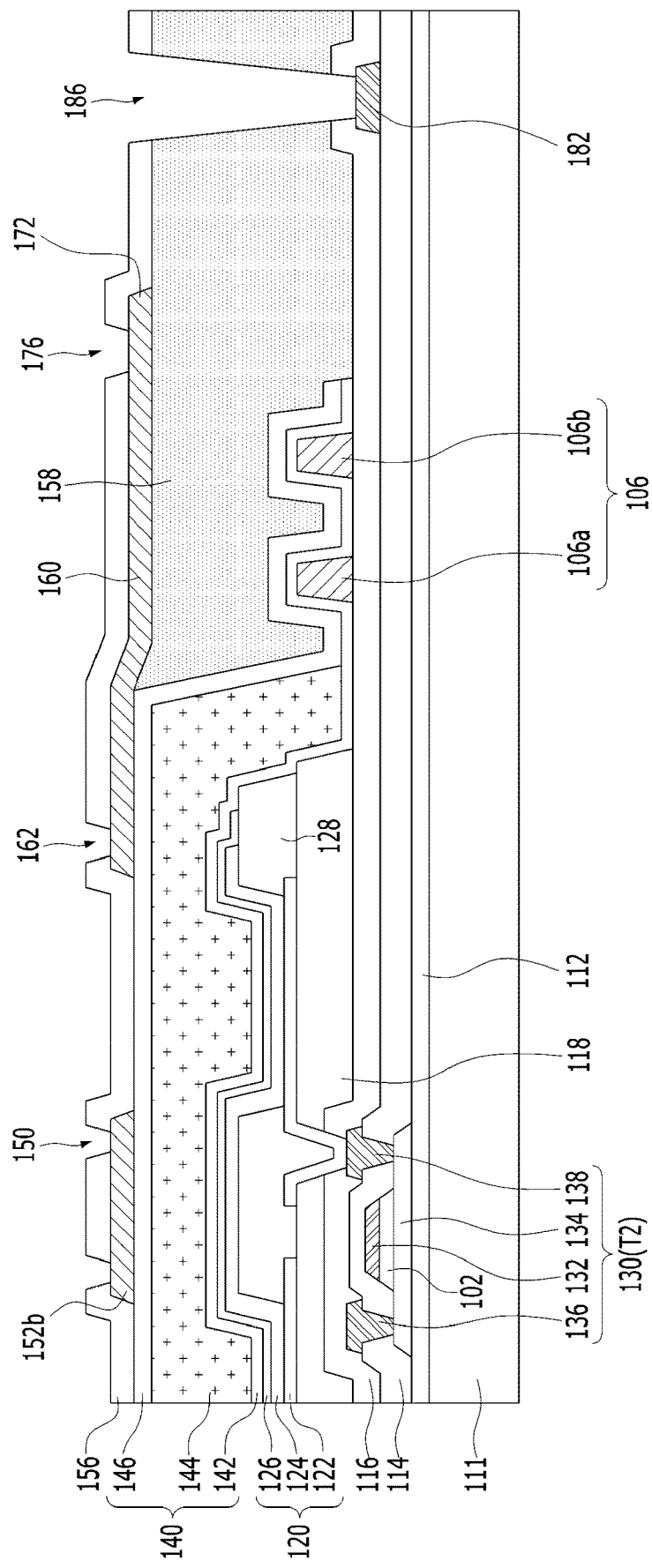

Referring to FIG. 8C, a touch insulating film 156 having a touch contact hole 150, a routing contact hole 162, a touch pad contact hole 176, and a display pad contact hole 186 is formed on the substrate 111, on which the first bridge 152b, the touch pad lower electrode 172, and the routing line 160 are formed.

Specifically, an inorganic insulating material or an organic insulating material is applied to the entire surface of the substrate 111, on which the first bridge 152b, the touch pad lower electrode 172, and the routing line 160 are formed, so as to form a touch insulating film 156. Here, the touch insulating film 156 is formed of an inorganic insulating material, such as $SiN_x$, SiON, or $SiO_2$, or an organic insulating material, such as photoacryl, parylene, or a siloxane-based organic insulating material. Subsequently, the touch insulating film 156 is etched using a photoresist pattern, which is formed by photolithography using a photomask, as a mask, and then the outer planarization layer 158 and a passivation film 116, disposed on the display pad lower electrode 182, are sequentially etched. As a result, a touch contact hole 150, a routing contact hole 162, a touch pad contact hole 176, and a display pad contact hole 186 are formed. Here, the touch contact hole 150, the routing contact hole 162, and the touch pad contact hole 176 are formed through the touch insulating film 156, and the display pad contact hole 186 is formed through the touch insulating film 156, the outer planarization layer 158 and the passivation film 116.

Figure 8D:
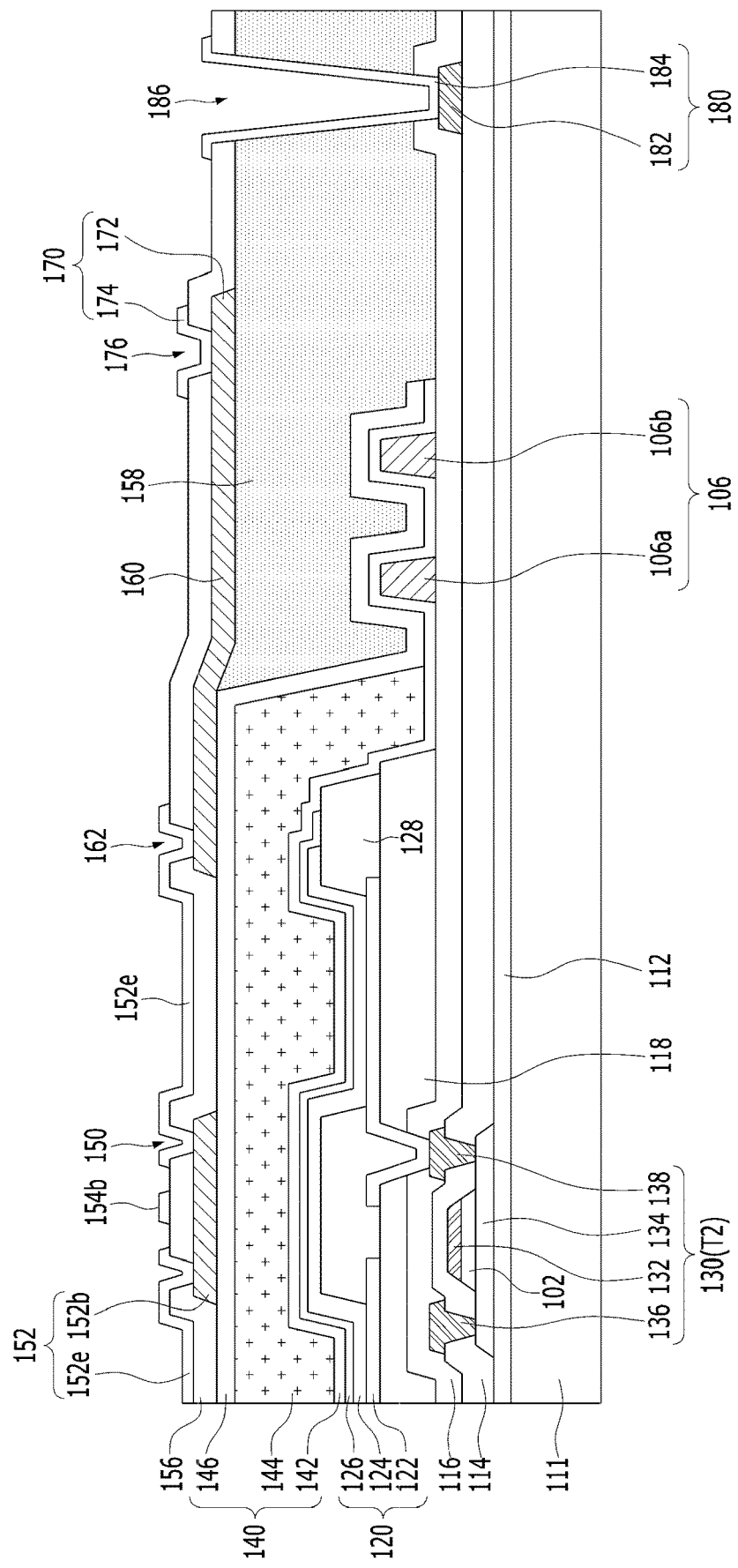

Referring to FIG. 8D, first and second touch electrodes 152e and 154e, a second bridge 154b, a touch pad upper electrode 174, and a display pad upper electrode 184 are formed on the substrate 111, on which the touch insulating film 156, having formed therein the touch contact hole 150, the routing contact hole 162, the touch pad contact hole 176, and the display pad contact hole 186, is formed.

Specifically, a second conductive layer is deposited on the substrate 111, on which the touch contact hole 150, the routing contact hole 162, the touch pad contact hole 176, and the display pad contact hole 186 are formed. Here, the second conductive layer is formed of IGZO, IZO, ITO, or ZnO. Subsequently, the second conductive layer is patterned by photolithography and etching to form first and second touch electrodes 152e and 154e, a second bridge 154b, a touch pad upper electrode 174, and a display pad upper electrode 184.

Figure 9:
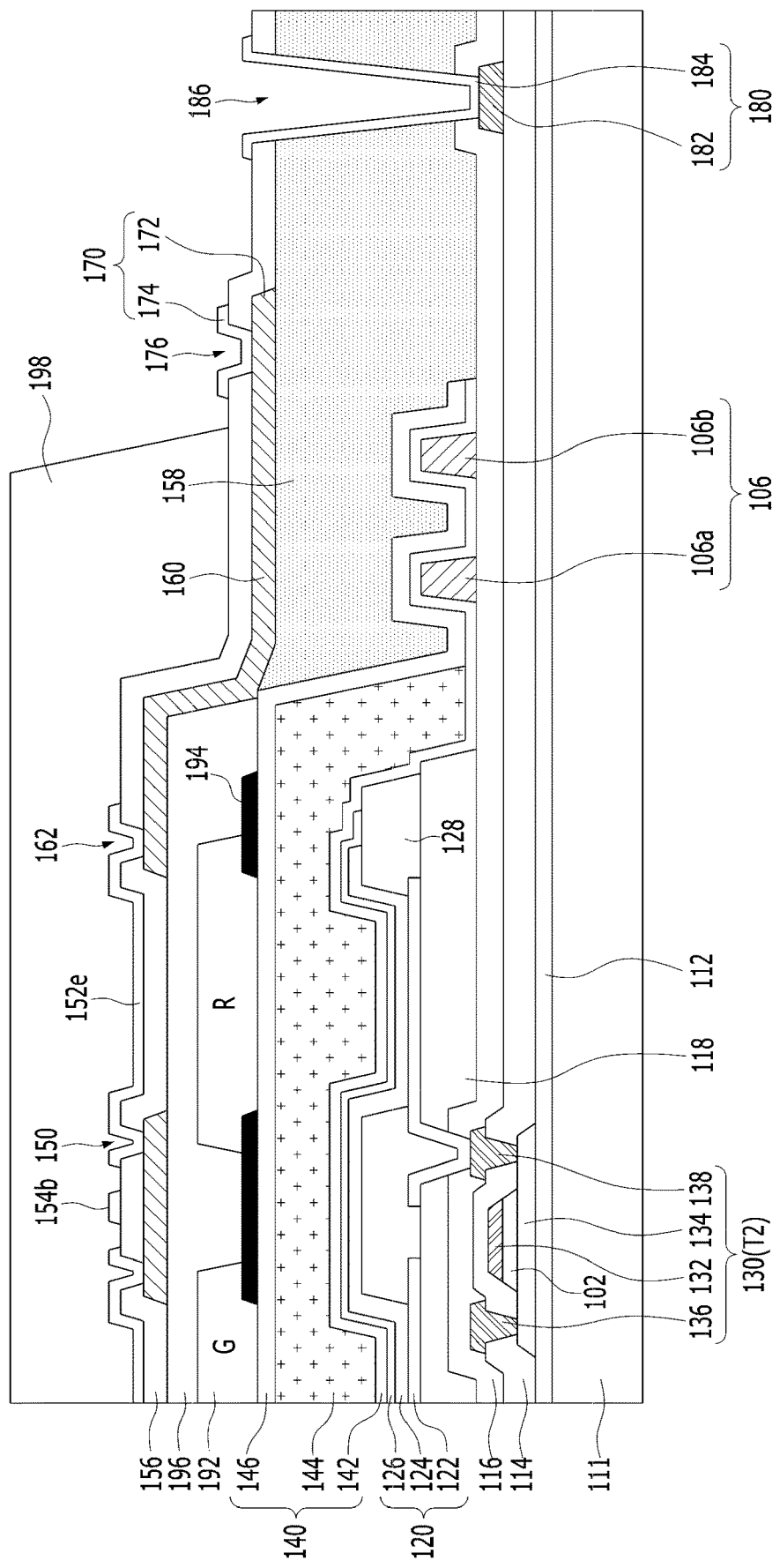
FIG. 9 is a sectional view showing an organic light-emitting display device having a touch sensor according to a third embodiment of the present disclosure.

FIG. 9 is a sectional view showing an organic light-emitting display device having a touch sensor according to a third embodiment of the present disclosure.

The organic light-emitting display device shown in FIG. 9 includes the same components as the organic light-emitting display device shown in FIG. 3, 6, or 7, but differs in that a color filter 192 is further provided between the encapsulation structure 140 and the touch electrodes 152e and 154e. Consequently, a detailed description of the same components will be omitted.

The color filter 192 is formed between a touch-sensing line 154 and a light-emitting element 120 and between a touch-driving line 152 and the light-emitting element 120. The distance between the touch-sensing line 154 and the light-emitting element 120 and between the touch-driving line 152 and the light-emitting element 120 is increased by the color filter 192. Consequently, it is possible to minimize the magnitude of parasitic capacitance formed between the touch-sensing line 154 and the light-emitting element 120 and between the touch-driving line 152 and the light-emitting element 120, thereby preventing interaction due to coupling between the touch-sensing line 154 and the light-emitting element 120 and between the touch-driving line 152 and the light-emitting element 120. In addition, the color filter 192 may prevent a liquid chemical (e.g., a developing solution or an etching solution), which is used to form the touch-sensing line 154 and the touch-driving line 152, or external moisture from permeating into a light-emitting stack 124. Consequently, the color filter 192 may prevent damage to the light-emitting stack 124, which has low resistance to liquid chemicals or to moisture. Meanwhile, as shown in FIG. 9, the touch electrodes 152e and 154e have been described as being disposed on the color filter 192 by way of example. Alternatively, the color filter 192 may be disposed on the touch electrodes 152e and 154e. In this case, the touch electrodes 152e and 154e are disposed between the color filter 192 and the encapsulation structure 140.

A black matrix 194 is disposed between color filters 192. The black matrix 194 serves to divide sub-pixel areas from each other and to prevent optical interference between adjacent sub-pixels and screen bleed. The black matrix 194 may be formed of a high-resistance black insulating material, or may be formed by stacking at least two of red (R), green (G), and blue (B) color filters 192. In addition, a touch planarization layer 196 is formed on the substrate 111, on which the color filter 192 and the black matrix 194 are formed. The substrate 111, on which the color filter 192 and the black matrix 194 are formed, is planarized by the touch planarization layer 196.

Figure 10A:
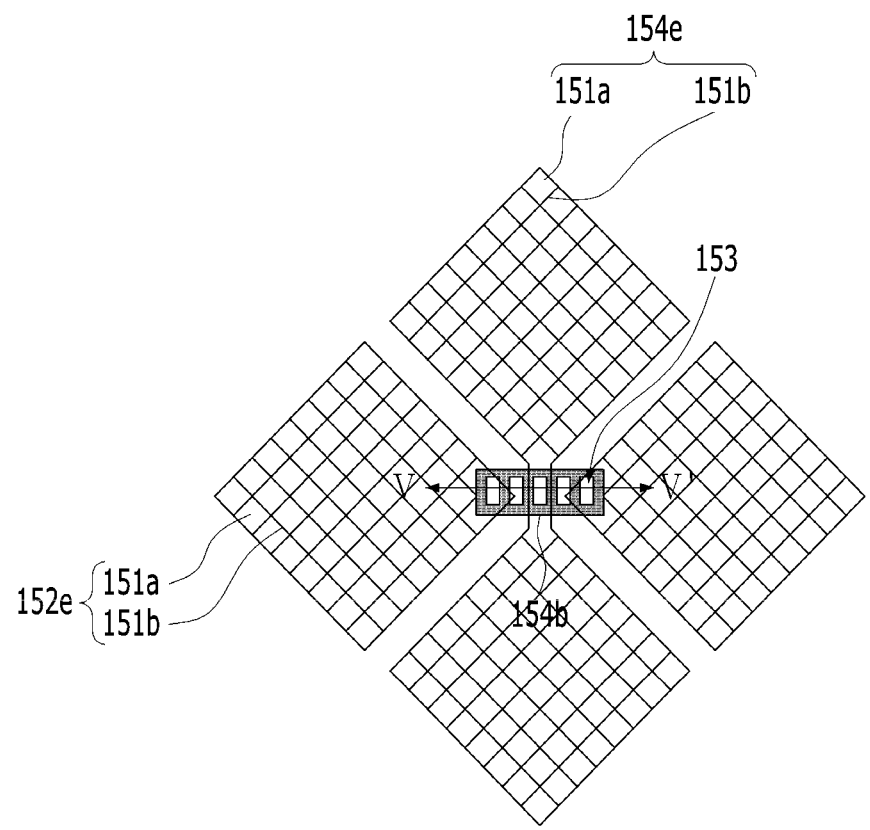
FIGS. 10A and 10B are a plan view and a sectional view showing another embodiment of first and second touch electrodes and a second bridge shown in FIG. 3.
Figure 10B:
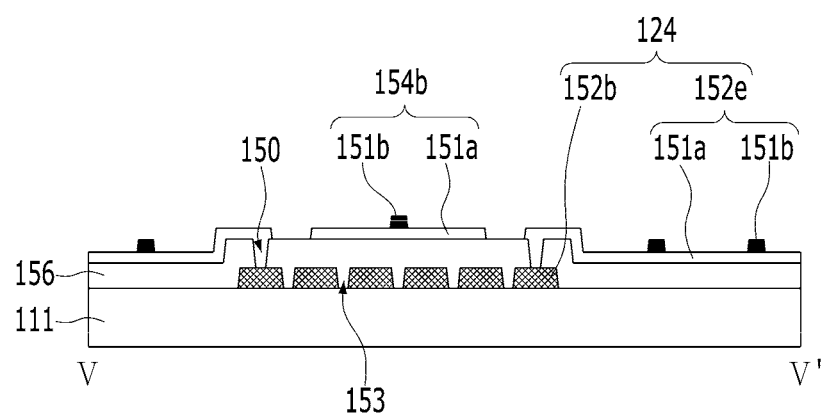

Meanwhile, in the present disclosure, as shown in FIG. 9, a touch passivation film 198 for exposing a display pad 180 and a touch pad 170 may be further provided. The touch passivation film 198 is formed so as to cover the touch electrodes 152e and 154e, bridges 152b and 154b, and a routing line 160, thereby preventing the same from being damaged by external impact or moisture. The touch passivation film 198 is formed of an organic insulating material, such as an epoxy or acrylic material, or is configured in the form of a circular polarizer, Although, in the present disclosure, the first and second touch electrodes 152e and 154e and the first and second bridges 152b and 154b have been described as being formed in a plate shape using a transparent conductive film by way of example, as shown in FIG. 2, the same may be formed in a mesh shape, as shown in FIGS. 10A and 10B. That is, each of the first and second touch electrodes 152e and 154e and the first bridge 152b may include a transparent conductive film 151a, such as ITO or IZO, and a mesh-shaped opaque conductive layer 151b disposed on or under the transparent conductive film 151a. Alternatively, each of the first and second touch electrodes 152e and 154e and the first bridge 152b may include only a mesh-shaped opaque conductive layer 151b. At this time, the opaque conductive layer 151b is formed of at least one of Ti, Al, Mo, MoTi, Cu, and Ta, which exhibits higher conductivity than the transparent conductive film 151a, so as to have at least one-layer structure. For example, each of the first and second touch electrodes 152e and 154e and the first bridge 152b is formed to have a three-layer stack structure, such as Ti/Al/Ti, MoTi/Cu/MoTi, or Ti/Al/Mo.

Consequently, the resistance and capacitance of each of the first and second touch electrodes 152e and 154e and the first bridge 152b, including the opaque conductive layer 151b, which exhibits higher conductivity than the transparent conductive film 151a, are reduced, whereby an RC time constant is reduced and thus touch sensitivity is improved. In addition, the line width of each of the first and second touch electrodes 152e and 154e and the first bridge 152b, which are formed in the mesh shape, is very small, with the result that it is possible to prevent the reduction of an aperture ratio and transmittance due to the first and second touch electrodes 152e and 154e and the first bridge 152b.

Meanwhile, the second bridge 154b, which is disposed in a plane different from the plane in which the touch electrodes 152e and 154e are disposed and which is formed of an opaque conductive film, is provided with a plurality of slits 153, as shown in FIGS. 10A and 10B. The area of the second bridge 154b, which has a plurality of slits 153, may be smaller than the area of a bridge having no slits 153. Consequently, it is possible to reduce the amount of external light that is reflected by the second bridge 154b, thereby preventing the reduction of visibility. The second bridge 154b, which has the slits 153, overlaps a bank 128, whereby it is possible to prevent the reduction of an aperture ratio due the second bridge 154b, which is formed of an opaque conductive film.

Furthermore, in the present disclosure, the mutual-capacitance type touch sensor including the touch-sensing line 154 and the touch-driving line 152, which intersect each other in the state in which the touch insulating film 156 is disposed therebetween, has been described by way of example. Alternatively, the present disclosure may be applied to a self-capacitance type touch sensor. Each of a plurality of self-capacitance type touch electrodes has an electrically independent self capacitance. Consequently, the touch electrodes may be used as self-capacitance type touch sensors for detecting variation in capacitance due to a user's touch. That is, routing lines 160 connected to the self-capacitance type touch electrodes are disposed on the outer planarization layer 158, which fills the space between the dams 106 to planarize the space between the dams 106. Consequently, a short circuit between the routing lines 160 is prevented, whereby reliability is improved.

Figure 11:
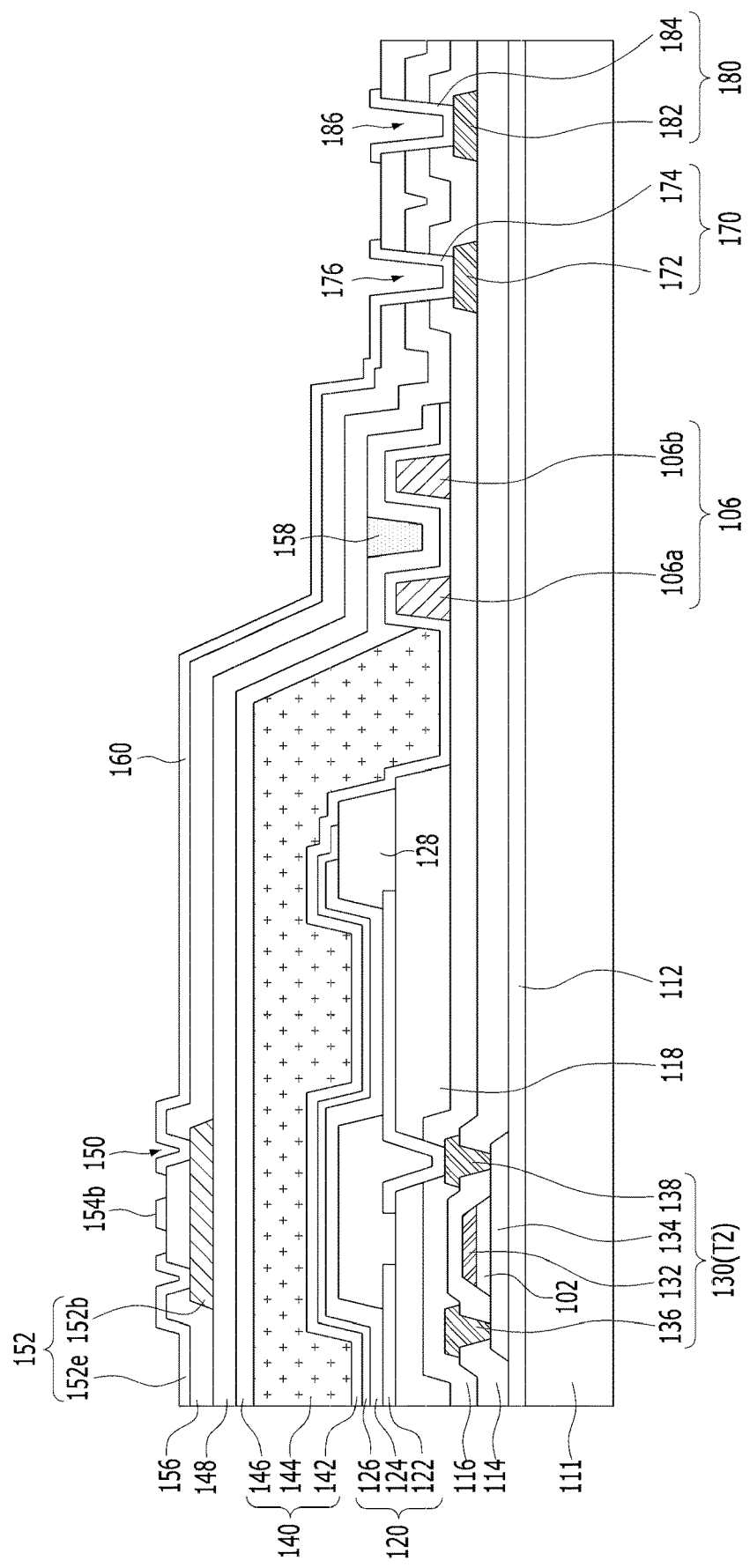
FIG. 11 is a sectional view showing an organic light-emitting display device having a touch sensor and a touch buffer film according to a fourth embodiment of the present disclosure.

Meanwhile, the display device according to the present invention may further include a touch buffer film 148 disposed between the second inorganic encapsulation layer 146 and the touch sensor, as shown in FIG. 11. The touch buffer film 148 is disposed on the second inorganic encapsulation layer 146 in the active area, and is disposed on the second inorganic encapsulation layer 146 or the outer planarization layer 158 in the non-active area.

The touch buffer film 148 disposed under the touch insulating film 156 may extend to the pad region where the touch pad 170 is disposed. The touch buffer film 148 is disposed on the passivation film 116 in the pad region where the touch pad 170 and the display pad 180 are disposed. The touch buffer film 148 is between the passivation film 116 and the touch insulating film 156 in the pad region where the touch pad 170 and the display pad 180 are disposed.

The touch buffer film 148 is disposed along the outer planarization layer 158. In the case in which the touch buffer film 148 is disposed on the second inorganic encapsulation layer 146, the routing lines 160 are disposed along the outer planarization layer 158 on the outer planarization layer 158. In the case in which the touch buffer film 148 is disposed on the outer planarization layer 158, the routing lines 160 are disposed along the touch buffer film 148 on the touch buffer film 148.

Here, the touch buffer film 148 is formed of an inorganic insulating material or an organic insulating material. The inorganic insulating material may include silicon oxide, silicon nitride, and/or silicon oxynitride, and the organic insulating material may include acryl, photoacryl, parylene, or a siloxane-based organic insulating material. The touch buffer film 148 may be deposited by using various deposition methods, such as CVD, ALD, or sputtering.

In addition, the touch buffer film 148 shown in FIG. 11 may be further provided in the organic light-emitting display device according to the second embodiment of the present invention shown in FIG. 6.

In addition, the organic encapsulation layer 144 may be formed of a same material as the outer planarization layer 158. The organic encapsulation layer 144 may be diffused between the dams 106, excluding the outermost dam 106, which is closest to the pad area. In this case, the outer planarization layer 158 is disposed so as to cover the organic encapsulation layer 144 diffused between the dams 106. Meanwhile, an organic dielectric film formed of an organic material may be disposed between the dams 106, in addition to the organic encapsulation layer 144.

Furthermore, the non-active area may be used as a bendable area, which is configured to be bent toward the rear surface of the active area. In this case, the non-active area, in which the touch pad 170 and the display pads 180 are disposed, may be bent toward the rear surface of the active area. Consequently, the area ratio of the active area to the entire screen of the organic light-emitting display device is maximized, and the area ratio of the non-active area, i.e. the bezel area, to the entire screen of the organic light-emitting display device is minimized. Meanwhile, the left area, the right area, and the lower area of the display device, in which the routing lines 160 are disposed, may also be bent, in addition to the upper area of the display device, in which the touch pad 170 and the display pads 180 are disposed.

As is apparent from the above description, in the display device having the touch sensor according to the present disclosure, the outer planarization layer, which fills the space between the dams to planarize the step formed by the height of the dams, is formed in the outer region of the substrate, which does not overlap the light-emitting element. Consequently, it is possible to prevent the residual photoresist film from remaining in the space between the dams, whereby it is possible to prevent a short circuit between the routing lines in the space between the dams. In addition, the touch electrodes are disposed on the encapsulation structure, with the result that an additional bonding process is not required, whereby the process is simplified and cost is reduced.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate having an active area and a non-active area;
   a light-emitting element disposed on the substrate;
   an encapsulation structure disposed on the light-emitting element, the encapsulation structure comprising a first inorganic encapsulation layer, a second inorganic encapsulation layer on the first inorganic encapsulation layer, and the organic encapsulation layer interposed between the first inorganic encapsulation layer and the second inorganic encapsulation layer;
   a plurality of touch electrodes and a plurality of bridges disposed on the encapsulation structure;
   a touch insulating film disposed between the touch electrodes and bridges;
   a plurality of routing lines disposed in the non-active area;
   at least one dam disposed in the non-active area; and
   at least one first planarization layer disposed in the non-active area, and disposed on the second inorganic encapsulation layer,
   wherein the touch insulating film, the first planarization layer, and the second inorganic encapsulation layer overlap each other in the non-active area, and
   wherein the first planarization layer is interposed between the touch insulation film and the second inorganic encapsulation layer.

2. The display device according to claim 1, wherein the first planarization layer fills a space between the organic encapsulation layer and the dams.

3. The display device according to claim 1, wherein the routing lines are connected respectively to the touch sensors.

4. The display device according to claim 1, wherein the first planarization layer covers the at least one dam and has a height corresponding to the upper surface of the organic encapsulation layer up to a pad disposed on the substrate.

* * * * *